(12) United States Patent
Pan et al.

(10) Patent No.: US 8,251,719 B1
(45) Date of Patent: Aug. 28, 2012

(54) FLASH DRIVE

(75) Inventors: Jian-Chun Pan, Shenzhen (CN); Hai-Qing Zhou, Shenzhen (CN); Yi-Xin Tu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 0 days.

(21) Appl. No.: 13/101,143

(22) Filed: May 5, 2011

(30) Foreign Application Priority Data

Apr. 21, 2011 (CN) .......................... 2011 1 0100889

(51) Int. Cl.
*H01R 13/44* (2006.01)
(52) U.S. Cl. ........................................................ 439/142
(58) Field of Classification Search .................. 439/660, 439/131, 136, 142, 140
See application file for complete search history.

(56) References Cited

U.S. PATENT DOCUMENTS

| 7,275,941 | B1 * | 10/2007 | Bushby | 439/133 |
| 7,713,074 | B2 * | 5/2010 | Poo et al. | 439/136 |
| 7,740,493 | B2 * | 6/2010 | Ni et al. | 439/131 |

* cited by examiner

*Primary Examiner* — Javaid Nasri
(74) *Attorney, Agent, or Firm* — Altis Law Group, Inc.

(57) ABSTRACT

A flash drive includes a frame and a main body. A receiving portion defining a receiving space therein is formed on an end of the frame. Two arms extend from opposite ends of the receiving portion. A universal serial bus (USB) connector is formed on an end of the main body. The main body is slidably and pivotably installed between the arms. The main body is operable to slide toward the receiving portion to insert the USB connector into the receiving space. And when the USB connector is received in the receiving space, the main body is operable to slide away from the receiving portion, to move the USB connector out from the receiving space, and the main body is then pivotable relative to the arms.

4 Claims, 5 Drawing Sheets

FLASH DRIVE

CROSS-REFERENCE OF RELATED APPLICATION

Relevant subject matter is disclosed in a pending U.S. patent application, titled "FLASH DRIVE", with the application Number 13/097,103, which is assigned to the same assignee as this patent application.

BACKGROUND

1. Technical Field

The present disclosure relates to a universal serial bus (USB) flash drive.

2. Description of Related Art

A casing for protecting a USB connector of a flash drive is generally separable from the flash drive. As a result, the casing may be lost easily.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, all the views are schematic, and like reference numerals designate corresponding parts throughout the several views.

DETAILED DESCRIPTION

The disclosure, including the accompanying drawings, is illustrated by way of example and not by way of limitation. It should be noted that references to "an" or "one" embodiment in this disclosure are not necessarily to the same embodiment, and such references mean at least one.

Figure 1:
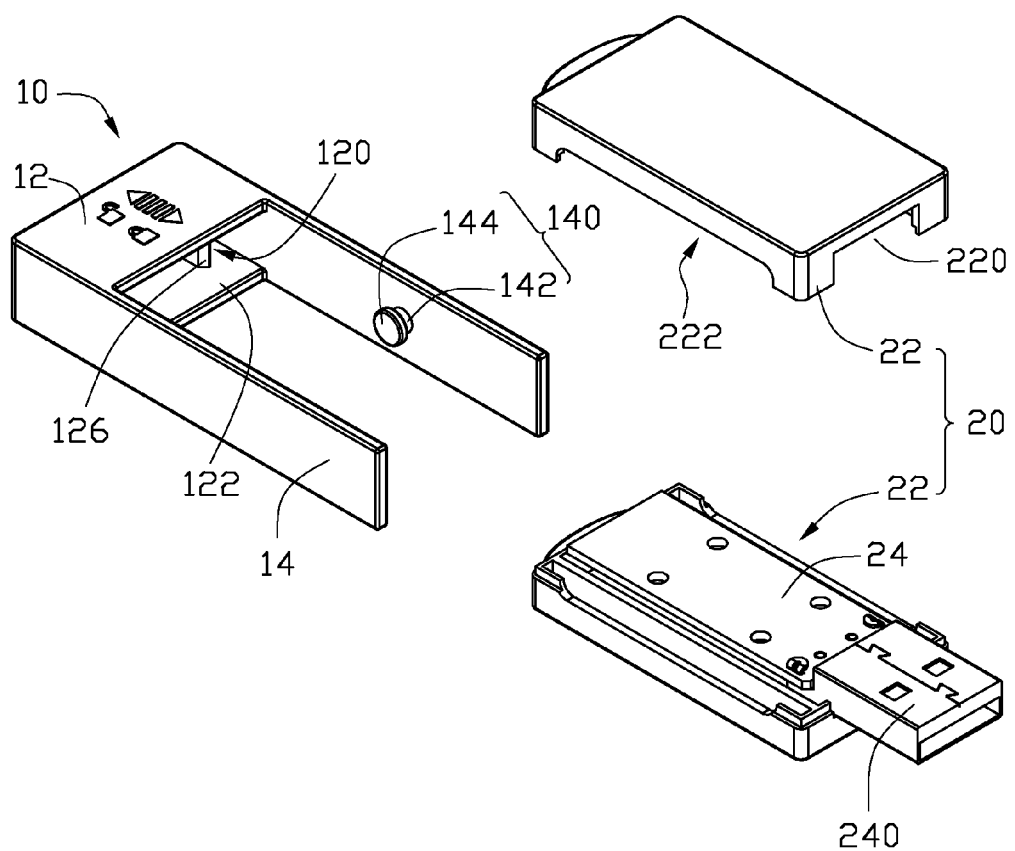
FIG. 1 is an exploded, isometric view of an exemplary embodiment of a flash drive; the flash drive includes a frame and a main body with a universal serial bus (USB) connector.

Referring to FIG. 1, an exemplary embodiment of a flash drive includes a frame 10 and a main body 20 pivotably installed to the frame 10.

The frame 10 includes a substantially rectangular box-shaped receiving portion 12 with a receiving space 120, and two parallel arms 14 extending away from opposite ends of the receiving portion 12. The receiving portion 12 defines an opening 122 in a front side of the receiving portion 12, between the arms 14 and communicating with the receiving space 120. An end wall (not shown) is formed on a rear end of the receiving portion 12 opposite to the opening 122, to cover the receiving space 120. Two blocking pieces 126 parallel to the arms 14 are formed in the receiving space 120, respectively adjacent to the arms 14. A protrusion 140 protrudes from an inner surface of each arm 14 toward the other arm 14. Each protrusion 140 includes a rod 142 extending from the corresponding arm 14 and a head 144 formed on a distal end of the rod 142.

The main body 20 includes two holders 22 engaging with each other to form a box-shaped member, and a memory 24 enclosed by the holders 22. Each holder 22 defines an opening 220 in an end and two slots 222 in opposite sides of the main body 20 along a direction that the USB connector 240 extends. A universal serial bus (USB) connector 240 extends from an end of the memory 24.

Figure 3:
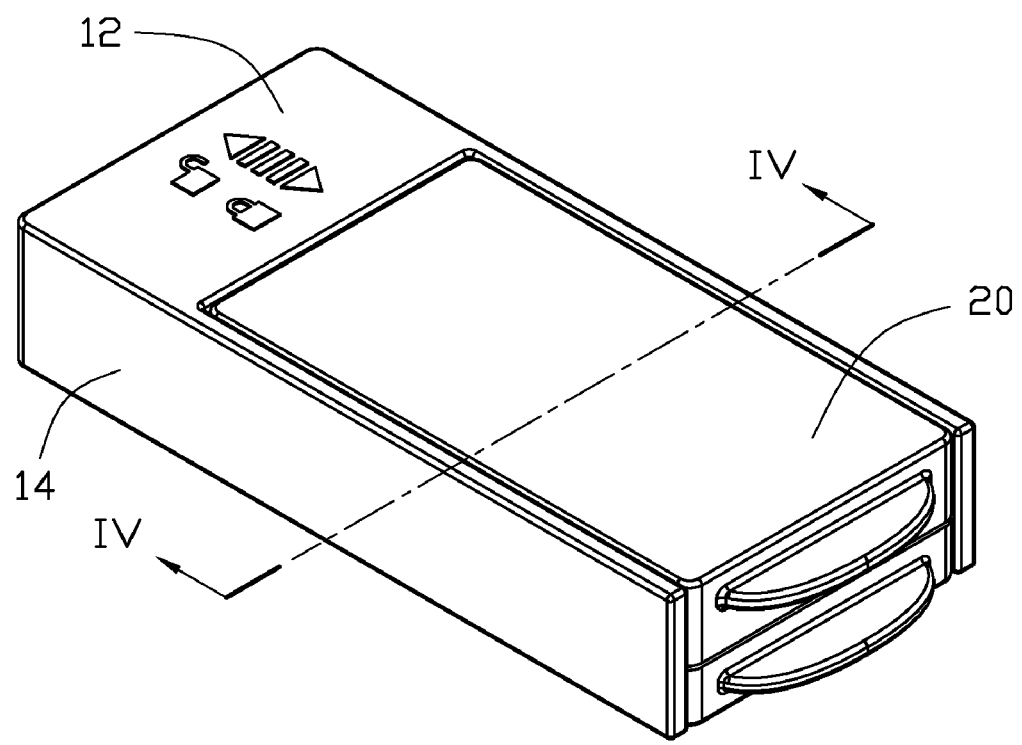
FIG. 3 is similar to FIG. 2, but showing the USB connector received in the frame.
Figure 4:
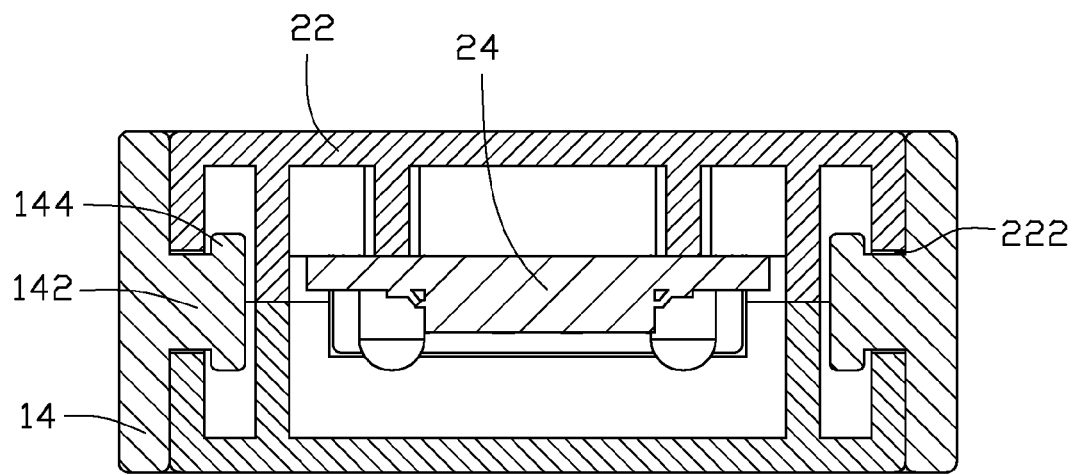
FIG. 4 is a sectional view of FIG. 3, taken along the line IV-IV.

Referring to FIGS. 3 and 4, in assembly, the memory 24 is received in one of the holders 22, and the USB connector 240 extends out through the opening 220 of the one holder 22. The one holder 22 is sandwiched between the arms 14, and the USB connector 240 is received in the receiving space 120 and sandwiched between the blocking pieces 26. The rods 142 of the protrusions 140 are respectively slidably positioned in the corresponding slots 222, and the heads 144 of the protrusions 140 are blocked by inner surfaces of the sides of the one holder 22. The other holder 22 is then positioned to cover the one holder 22. Thereby, when the USB connector 240 is not in use, the USB connector 240 can be received in the receiving space 120 of the frame 10 to protect the USB connector 240.

Figure 2:
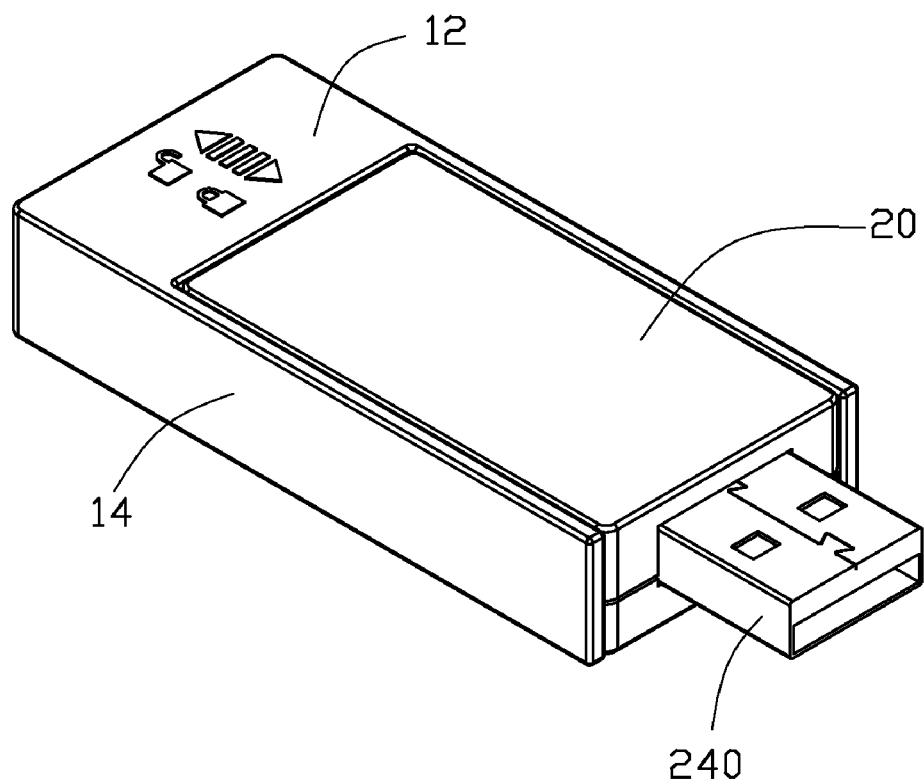
FIG. 2 is an assembled, isometric view of the flash drive of FIG. 1, showing the USB connector extending out of the frame.
Figure 5:
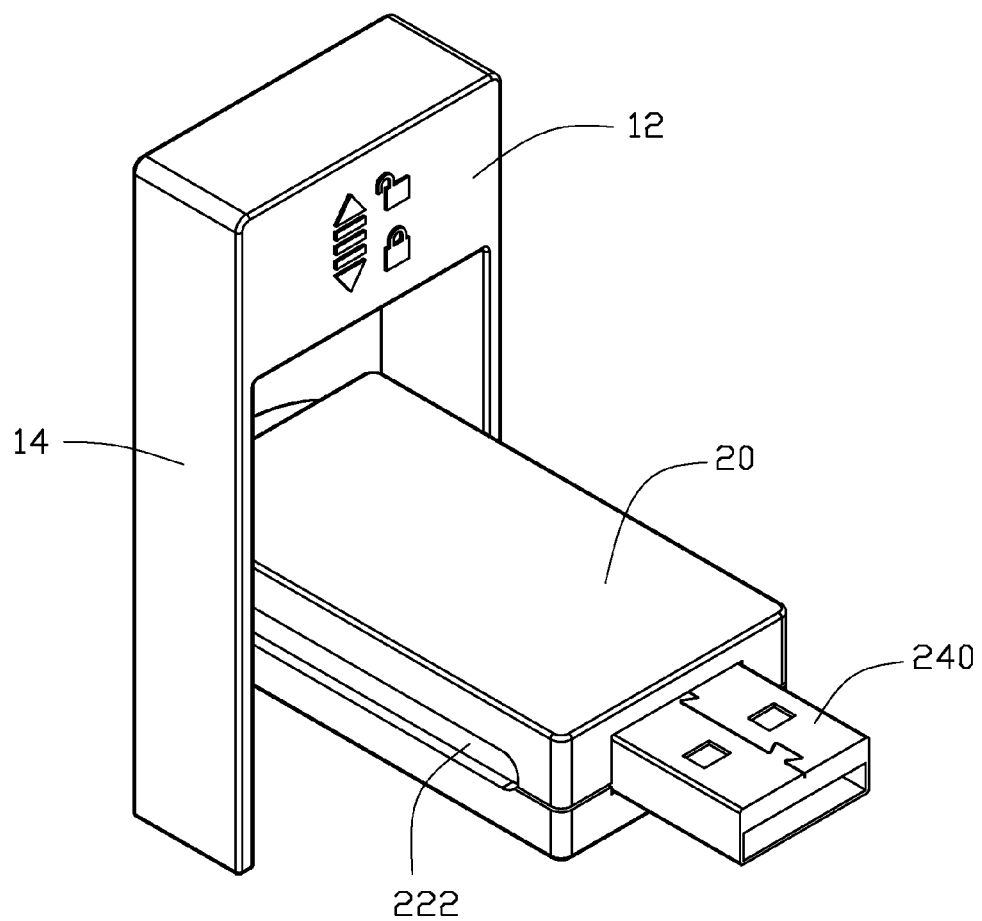
FIG. 5 is similar to FIG. 2, but showing a state of use.

Referring to FIGS. 2 and 5, in use of the USB connector 240, the main body 20 is slid out from the receiving space 120 of the receiving portion 12, until the USB connector 240 is clear of the opening 122. At this time, the main body 20 may be pivoted about the protrusions 140, thereby positioning the USB connector 240 for use. After use, the USB connector 240 can be pivoted back and pushed into the receiving space 120.

It is believed that the present embodiments and their advantages will be understood from the foregoing description, and they will be apparent that various changes may be made thereto without departing from the spirit and scope of the description or sacrificing all of their material advantages, the examples hereinbefore described merely being exemplary embodiment.

What is claimed is:

1. A flash drive, comprising:
   a U-shaped frame comprising a receiving portion defining a receiving space therein, and two arms extending from opposite ends of the receiving portion; and
   a main body comprising a universal serial bus (USB) connector, the main body slidably and pivotably installed between the arms;
   wherein a protrusion protrudes from an inner surface of each arm toward the other arm, an elongate slot for slidably and pivotably receiving a corresponding protrusion is defined in each of opposite sides of the main body along a direction along which the USB connector extends; and
   wherein the main body is operable to slide toward the receiving portion along the slots to insert the USB connector into the receiving space; and when the USB connector is received in the receiving space, the main body is operable to slide away from the receiving portion to move the USB connector out from the receiving space, and the main body is then pivotable relative to the arms.

2. The flash drive of claim 1, wherein two blocking pieces are formed in the receiving space of the receiving portion, respectively adjacent to the ends of the receiving portion, the USB connector is sandwiched between the blocking pieces, in response to the USB connector being received in the receiving space.

3. The flash drive of claim 1, wherein each protrusion comprises a rod extending from the corresponding arm and a head formed on a distal end of the rod, the rods are slidably and pivotably received in the corresponding slots, the heads are blocked by inner surfaces of the main body.

4. A flash drive, comprising:
a U-shaped frame comprising a receiving portion defining a receiving space therein, two arms extending from opposite ends of the receiving portion, and a protrusion protruding from an inner surface of each arm toward the other arm; and
an elongate main body comprising two opposite ends, two opposite sides connecting the ends, a universal serial bus (USB) connector extending from one of the ends of the main body, and an elongate slot defined in each of the sides along a direction along which the USB connector extends;
wherein the protrusions are pivotably received in the elongate slots, and slidable along the elongate slots to selectively insert the USB connector or the other one of the ends of the main body into the receiving space.

* * * * *